United States Patent [19]

Donaldson et al.

[11] Patent Number: 5,311,081

[45] Date of Patent: May 10, 1994

[54] DATA BUS USING OPEN DRAIN DRIVERS AND DIFFERENTIAL RECEIVERS TOGETHER WITH DISTRIBUTED TERMINATION IMPEDANCES

[75] Inventors: Darrel D. Donaldson, Lancaster; Roger A. Dame, West Brookfield, both of Mass.; Ronald E. Nikel, Ithaca, N.Y.

[73] Assignee: Digital Equipment Corporation, Maynard, Mass.

[21] Appl. No.: 861,747

[22] Filed: Apr. 1, 1992

[51] Int. Cl.$^5$ .................................. H03K 19/0175
[52] U.S. Cl. .................................. 307/475; 307/443
[58] Field of Search ............... 307/475, 443, 465, 243

[56] References Cited

U.S. PATENT DOCUMENTS

| | | | |
|---|---|---|---|
| 4,223,277 | 9/1980 | Taylor et al. | 307/456 |
| 4,739,193 | 4/1988 | Doty, II | 307/475 |
| 4,774,422 | 9/1988 | Donaldson et al. | 307/443 |
| 4,970,410 | 11/1990 | Matsushita et al. | 307/465 |
| 5,023,488 | 6/1991 | Gunning | 307/443 |
| 5,070,256 | 12/1991 | Grondalski | 307/443 |

FOREIGN PATENT DOCUMENTS 0049917  4/1982  European Pat. Off. ......... G06/ 3/04

OTHER PUBLICATIONS

"Logical Dotting of Tri-State Drivers", IBM Technical Disclosure Bulletin, vol. 30, No. 9, Feb. 1988, New York, pp. 250–252.

P. Boulay, "Push SCSI Performance to the Limit"; Electronic Design, vol. 38, No. 9, May 1990, Hasbrouck Heights, N.J., pp. 85–92, XP125954.

Primary Examiner—Edward P. Westin
Assistant Examiner—Jon Santamauro
Attorney, Agent, or Firm—Cesari and McKenna

[57] ABSTRACT

An open drain driver, differential receiver circuit for transmitting logic signals generated by metal oxide semiconductor (MOS) logic circuits over a data bus that uses distributed termination impedances. The distributed termination impedance values are chosen to minimize the data bus settling time both when a driver in a given module drives a signal consisting of alternating logic levels, as well as when two different drivers drive a given logic level in succession. Each open drain driver includes a multiplexor, a flip flop, an inverter stage, and a driver transistor. The multiplexor selects either a data signal to be transmitted or a deasserted data value to be passed to the input of the flip flop. The flip flop also accepts a test input, which sets the flip flop to a known state. As a result, no additional delay is inserted in the critical path between the rising edge of a flip flop clock input signal and the driver output. The companion differential receiver receives a reference voltage which is separately generated on each module, to permit the use of distributed power supplies while still adjusting for variations which may exist in a termination voltage from module to module.

35 Claims, 5 Drawing Sheets

DATA BUS USING OPEN DRAIN DRIVERS AND DIFFERENTIAL RECEIVERS TOGETHER WITH DISTRIBUTED TERMINATION IMPEDANCES

FIELD OF THE INVENTION

This invention relates generally to electronic system buses and particularly to a bus that uses open drain drivers and differential receivers together with distributed termination impedances.

BACKGROUND OF THE INVENTION

The switching speed of a computer bus often determines the overall system performance. For example, the computer may include multiple central processing units (CPU) module, multiple input/output (I/O) modules, and multiple memory modules. Each module communicates with the other modules via a bus, which is a set of parallel electrical signal paths. In a typical operation performed by the computer, a data word is read from the memory and then passed along the bus to the CPU for an arithmetic operation, and the CPU module then forwards the results of the operation back along the bus to the I/O module for output. The signal propagation characteristics of the bus, including both delay and settling time, thus determine the overall system speed, since the faster that data signals are transmitted and settled on the bus, the faster the system completes a particular task.

Perhaps the most common digital integrated circuit (IC) technology in use today is so-called complimentary metal oxide semiconductor (CMOS). Historically, the designers of some electronic systems interconnect the CMOS circuits on several different modules without special consideration of the impedance presented by the bus signal paths. While this is not of particular concern where the logic switching speeds are several orders of magnitude less than the bus propagation delay, it does become a problem for high performance systems, which may require switching speeds of 50 MegaHertz (MHz) or more over a bus which is a foot or more in length.

A failure to either properly terminate bus connections or to properly match impedances typically manifests itself as an increase in settling time. This is because the resultant overshoot and ringing must be allowed to settle before a bus receiver circuit may properly detect the data bit transmitted by a bus driver circuit. As a result, an extra delay must be added to the system bus cycle time to insure that the data bit may be detected at the receiver.

The settling time can be reduced somewhat if each bus signal path is treated as a transmission line having certain delay and energy storage characteristics. For example, it is well known that a transmission line terminated in its characteristic impedance reduces the settling time. Settling time can also be minimized by using a "party-line" type bus, that is, a bus where the drivers have open drain (for MOS circuit technologies) or open collector (for bipolar circuit technologies) output transistors which are connected through a common termination resistor to a termination supply voltage. With such a bus, one of the logic levels is represented by a non-asserted state, where the open drain/collector transistors are turned off.

However, there remains some question as to the optimum way to properly terminate a high performance bus. In particular, terminating the bus at each end may require placing the termination impedances on a center-plane or backplane, where it may or may not be convenient to mount discrete components. Alternatively, the termination impedances may be placed in the two circuit board modules on the extremities of the bus, but this has the disadvantage of requiring special variants of the modules when they are used at the ends of the bus. Another difficulty occurs when the system design dictates that each module have its own termination supply voltage, which means that the end termination technique can be difficult to implement.

A distributed termination technique has been used, in some applications, where each bus path in each module is terminated in the characteristic impedance of the bus. The distributed termination technique works reasonably well, but is not without its own problems. In particular, each driver must supply enough current to drive all of the termination impedances connected to the bus. This is not of particular concern in a small system having only a few modules, but as the number of modules increases, the extra current drive requirements increase the bus settling time.

There are several other considerations which further complicate the design of a bus. Often times, it is necessary to provide a "tri-statable" driver which has a separate disable input that causes the driver to release, or deassert, the bus. To provide this function, an extra transistor stage must be added to the output circuit in the bus driver, which adds propagation delay.

Furthermore, it is often desirable to provide a control signal that permits the driver to be disabled, for system test purposes. This permits the system to be tested by selectively disabling the drivers, to determine if any particular driver is "stuck", or failing to release the bus when it should. This usually means that another stage of transistors must be placed in the critical delay path of the driver.

All of these considerations are exacerbated when the bus drivers and receivers must be designed using the transistors available on standard Application Specific Integrated Circuits (ASICs) or gate arrays. The circuit designer is restricted in the number of transistors and the sizes available in such a situation.

What is needed is a distributed termination, bus driver/receiver circuit that minimizes bus propagation time. The circuit should provide an open drain output which may be disabled, as well as placed into a test state, without adding logic delays in the critical path of the driver. The design should be easily adaptable to standard gate arrays and ASICs by using only standard transistors.

SUMMARY OF THE INVENTION

The invention is a bus termination technique using an open drain/collector driver, differential receiver. Each module connected to the bus contains a termination impedance located on that module, and each module also generates is own termination supply voltage.

The value of the termination impedance is preferably chosen so that a minimum settling time is achieved both when a particular driver in a given module drives a signal consisting of alternating logic levels in succession, as well as when the drivers on two different modules successively drive the same logic level.

Each driver circuit includes a multiplexer, a flip flop, an inverter stage, and an open drain transistor. The multiplexer is controlled by an output enable signal that selects either a data signal or a deasserted data value to be passed to the data input of the flip flop. The flip flop also accepts a test input, which internally changes the flip flop to a preselected, known state that causes the bus to be deasserted. As a result, no additional delay is inserted in the critical path between the rising edge of a flip flop clock input signal and the driver output.

The companion differential receiver circuit receives a reference voltage which is separately generated for each module. This permits the use of distributed power supplies while allowing for variations which may exist in the reference voltage from module to module.

There are several other advantages to the invention. Since all of the termination impedances are placed on the circuit board modules, there is no need to mount components on a centerplane or backplane. In addition, the bus is terminated in an impedance that optimizes settling time regardless of the system configuration. For example, as the number of modules in a system increases, the cumulative termination impedance actually approaches the optimum fully loaded bus termination value. As a result, the bus performs much more uniformly as the system is changed from a minimum to a maximum configuration.

The invention is easily implemented using standard transistors available in a gate array or ASIC.

BRIEF DESCRIPTION OF THE DRAWINGS

The novel features believed to be characteristic of the invention are pointed out in the appended claims. The best mode for carrying out the invention and its particular features and advantages can be better understood by referring to the following detailed description, read together with the accompanying drawings, in which:

DETAILED DESCRIPTION OF ILLUSTRATIVE EMBODIMENTS

1. INTRODUCTION

Figure 1:
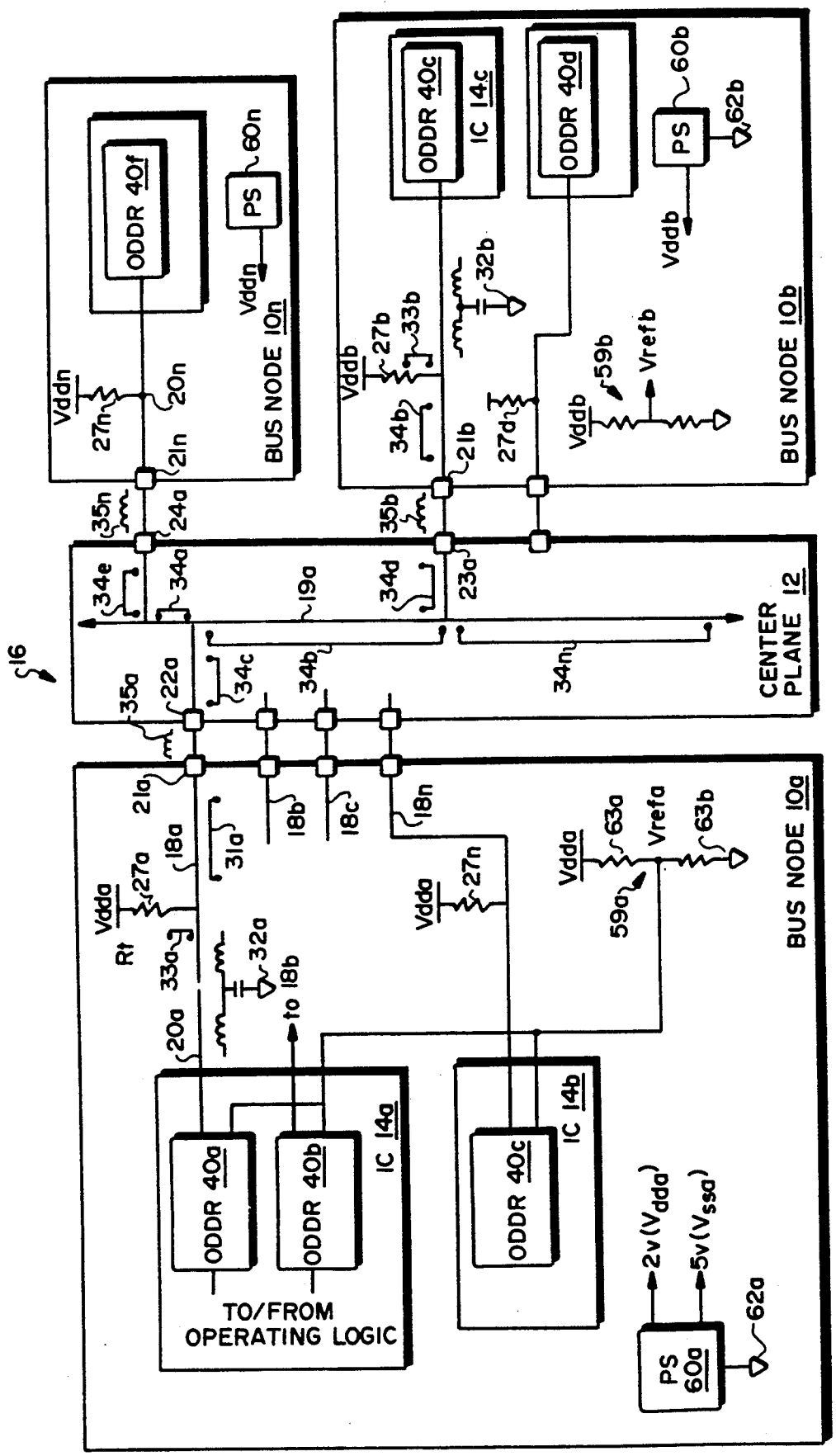
FIG. 1 is an electrical schematic diagram of an electronic bus that makes use of open drain driver and differential receiver circuits according to the invention.

FIG. 1 is a circuit diagram of an electronic system that makes use of a distributed termination, open drain driver and a distributed reference voltage, differential receiver according to the invention. The system includes a number of circuit board modules, or bus nodes $10a$, $10b$, . . . $10n$ (collectively, bus nodes 10) that plug into a centerplane 12. The centerplane 12 may also be a backplane or motherboard depending upon the desired physical orientation of the bus nodes 10 with respect to one another.

Each bus node 10 includes a printed circuit board (not shown) containing a number of integrated circuit chips (ICs) 14 mounted thereon. For example, bus node $10a$ includes ICs $14a$ and $14b$, bus node $10b$ includes ICs $14c$ and $14d$, and bus node $10n$ includes IC $14n$.

A parallel bus 16 permits logic signals to be passed between the ICs 14 on different bus nodes 10. The bus 16 consists of a number of individual conductive paths $18a$, $18b$, . . . $18n$ provided by the bus nodes 10 and the centerplane 12. For example, in a computer having a thirty-two bit wide data word, the bus 16 typically consists of thirty-two conductive paths $18a$, $18b$, . . . $18n$.

An exemplary conductive path $18a$ consists of a number of components, including a printed circuit board trace $20a$ in bus node $10a$, a connector $21a$ which provides an electrical connection between the trace $20a$ and the centerplane 12, a centerplane connector $22a$ which mates with connector $21a$, a trace $19a$ on centerplane 12 which connects connector $22a$ to other centerplane connectors $23a$ and $24a$, and connectors $21b$ and $21n$, which mate with connectors $23a$ and $24a$, respectively, which in turn connect the path $18a$ to the traces $20b$ and $20n$ in bus nodes $10b$ and $10n$.

The operating logic circuits in an exemplary IC $14a$ include open drain driver/receivers $40a$ and $40b$. An exemplary driver/receiver $40a$ permits transmission and reception of a single logic signal over the conductive path $18a$. A driver transistor (not shown in FIG. 1) in the driver/receiver $40a$ controls the transmission of a logic signal on the conductive bus path $18a$. For example, the bus path $18a$ is deasserted, to indicate a particular logic level (such as "false"), by disabling the driver transistor. The bus path $18a$ is asserted, to indicate the opposite logic level (such as "true"), by enabling the driver transistor to couple the bus path $18a$ to a ground reference node $62a$.

A fully loaded conductive path $18a$ having many bus nodes 10 and hence many driver/receivers 40 connected thereto is actually a fairly complex electrical circuit having distributed impedances of various types. For example, a portion of the path $18a$ between the IC $14a$ and a circuit node $30a$ actually sees a parasitic series inductance and parallel capacitance, indicated by reference numeral $32a$, presented by, for example, the chip package. The portion of conductive path $18a$ between the circuit node $30a$ and the termination resistance $27a$ is a small piece of transmission line $33a$; similarly, the portion of conductive path $18a$ between the circuit node $30a$ and connector $21a$ is another transmission line $34a$. The connectors $21a$ and $22a$ present a series inductance, as indicated by reference numeral $35a$. Furthermore, the trace $19a$ on the centerplane 12 is in reality a network of series and parallel transmission lines $34a$, $34b$, $34c$, $34d$, $34e$, and $34n$. The connectors $23a$ and $21b$ present a series inductance, $35b$. The trace $20b$ on bus node $10b$ is a pair of transmission lines $33b$ and $34b$, as well as another pair of series inductances and a parallel capacitance $32b$.

2. SELECTION OF DISTRIBUTED TERMINATION IMPEDANCES

The conductive paths 18 are terminated using impedances 27 which are distributed among the bus nodes 10. In particular, a termination resistor 27 is connected to the conductive path $18a$ in each of the bus nodes $10a$, $10b$, . . . , $10n$. Thus, bus node $10a$ has a termination resistor $27a$, bus node $10b$ has a termination resistor $27b$, and bus node $10n$ has a termination resistor $27n$. The other terminal of each termination resistor 27 is connected to a termination supply voltage located in each module. For example, the termination resistor $27a$ in bus node $10a$ is connected to a two volt (2 v) termination voltage Vdda generated by a power supply $60a$ located in bus node $10a$. Similarly, the other termination resistors $27b$, . . . , $27n$ are connected to their respective 2 v termination voltages generated by their own respective power supplies $60b$, . . . , $60n$.

The impedance, $R_t$, of the termination resistors 27 is chosen to insure minimum settling time and hence maximum operating speed. According to the invention, $R_t$ is chosen such that it is the best choice between two extremes, namely, a first condition, where a single driver 40 drives alternate logic zeros and logic ones in successive bus cycles, and a second condition, where two different drivers 40 drive the same logic level in successive bus cycles.

Figure 2:
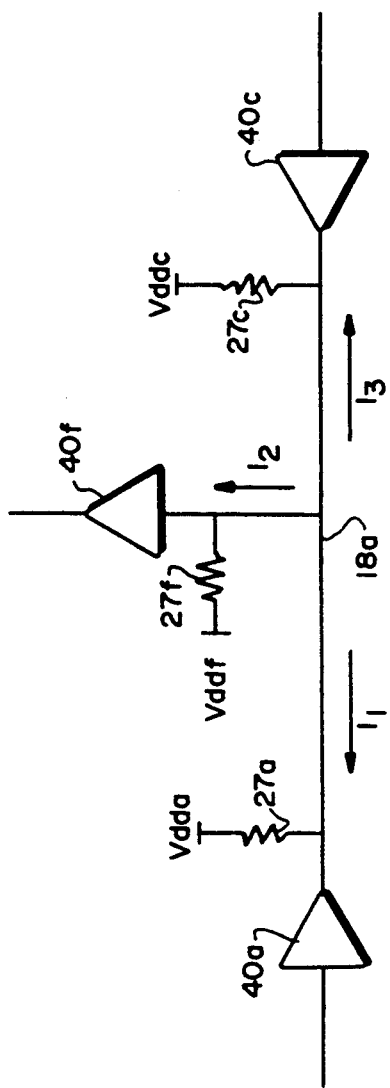
FIG. 2 is a schematic of two of the drivers and a receiver depicting two worst case conditions of interest.

Referring to FIG. 2, the first extreme condition exists when a single driver, such as the one associated with open drain driver/receiver 40a, transmits an alternating sequence of logic ones and zeroes to the receiver in open drain driver/receiver 40f. (Only the driver portion of driver/receiver 40a, and only the receiver portion of driver/receiver 40f are shown, for clarity.) In this first condition, as shown by the timing diagram in FIG. 3A, the bus path is thus alternately asserted and deasserted. So, for example, at time $t_1$, the output of driver 40a assumes the deasserted voltage level, at time $t2$ it assumes the asserted voltage level, and so forth. After a settling time, $t_n$, has elapsed, the transmitted deasserted or asserted logic level appears at the input to receiver 40f.

Referring back to FIG. 2, then, if $I_1$ represents the current flow into driver 40a, and $I_2$ represents the current flow into receiver 40f, the bus path 18a alternately experiences a net current flow into receiver 40f, and then no current flow.

Figure 3:
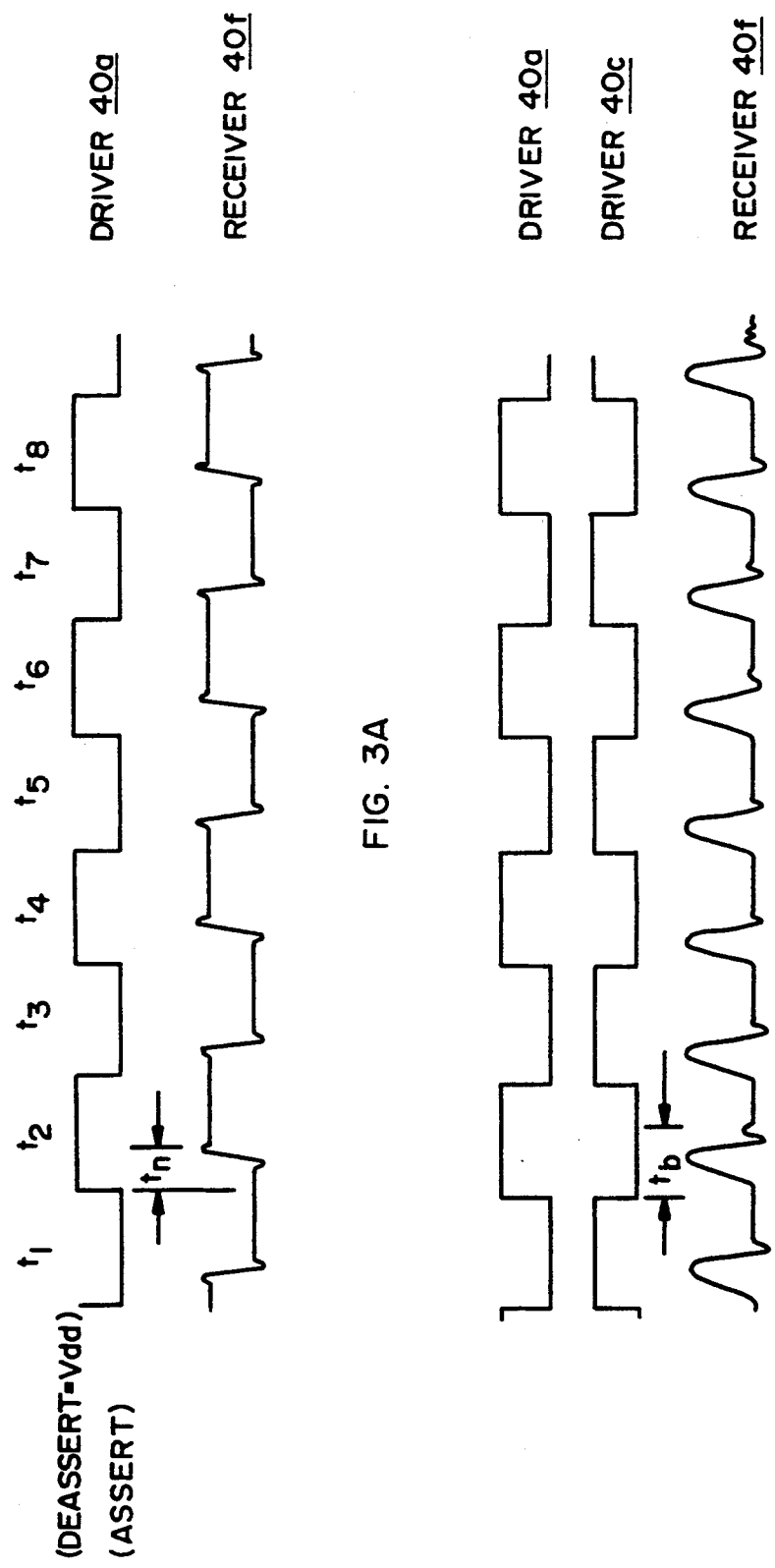
FIGS. 3A and 3B are timing diagrams for the two worst case conditions.

In the second extreme condition, two different drivers, 40a and 40c on opposite ends of the bus path 18a (FIG. 2), drive the same logic level in successive bus cycles. As shown by FIG. 3B, driver 40a asserts the bus path 18a during time $t_1$, and deasserts it during time $t_2$, while driver 40c deasserts the bus path 18a during time $t_1$, and asserts it during time $t_2$. The net effect at the receiver 40f is such that the bus remains at the same asserted logic level. However, as shown in FIG. 3B, the settling time, $t_n$, must still be allowed for, even though the bus is not changing its logic state.

The reason for this can be understood by referring back to FIG. 2 briefly. When driver 40a asserts the bus path 18a, and then driver 40c is required to assert the bus path 18a on the next bus cycle, then the current source changes from bus node 10a (FIG. 1) to bus node 10b. In that case, all of the energy stored in the bus path 18a originating at the pull-up resistor 27a, as well as the various voltages and currents stored in the distributed capacitances and inductances 31a, 32a, 33a, 34a-34n, and 35a-35n (FIG. 1) must change polarity in order for the bus path 18a to settle out. Thus, as shown in the table in FIG. 2, for this second condition, the bus path 18a will experience a di/dt approaching twice that seen in the first condition, from a negative to a positive flow direction.

Figure 4:
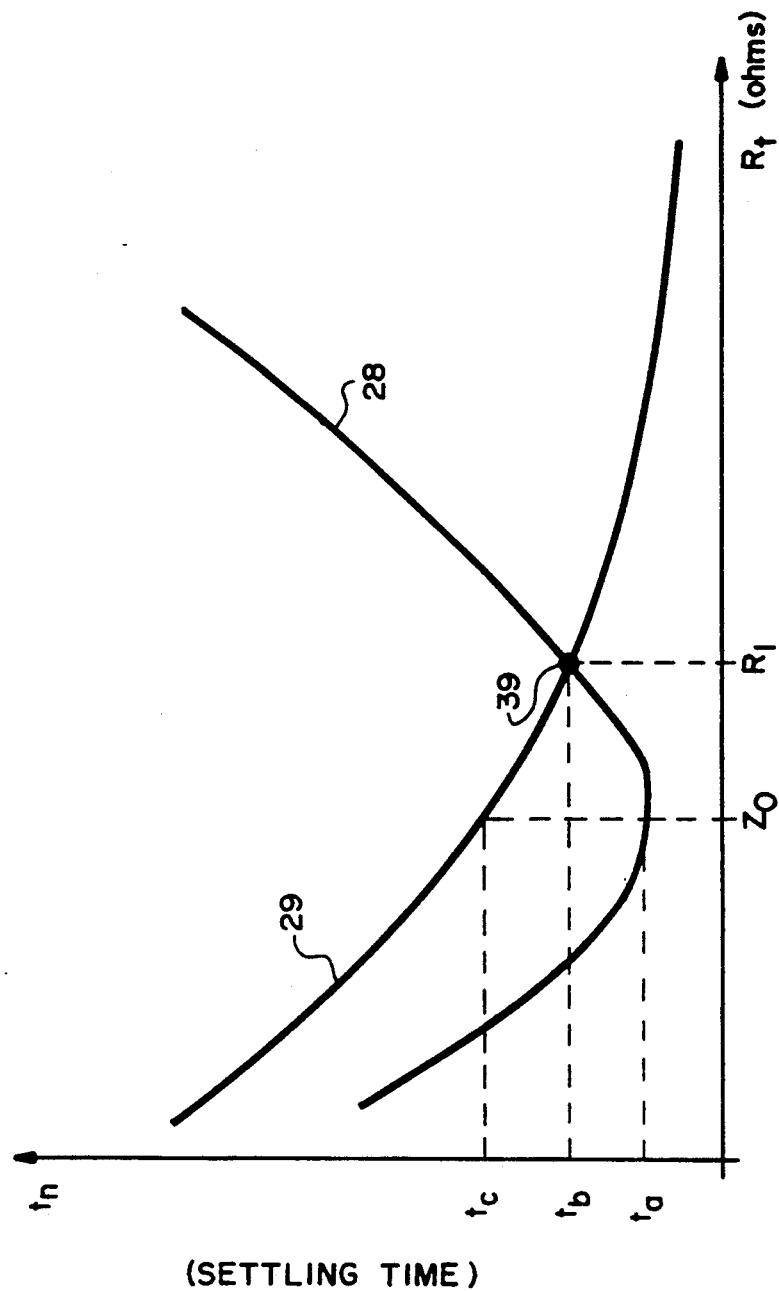
FIG. 4 is a plot of bus settling time, Ts, versus termination resistance, Rt, which shows how the termination resistance is chosen to optimize settling time.

The invention minimizes the settling time, for both of these extreme conditions, by properly selecting the termination resistance, $R_t$. Referring to FIG. 4, the illustrated curve 28 is a plot of settling time, $t_n$, versus termination resistance, $R_t$, for the aforementioned first condition where a single driver/receiver 40a is alternately driving ones and zeros on the bus path 18a. In this condition, as is well known, a minimum settling time, $t_a$, is provided when the termination resistance, $R_t$, is equal to $Z_o$, the characteristic impedance of the path 18a. As curve 28 shows, when the termination resistance $R_t$ increases above $Z_o$, reflections along the conductive path 18a increase, which in turn means that the conductive path 18a cannot be asserted or deasserted quite as quickly. Similarly, as the termination resistance, $R_t$, is decreased below $Z_o$, reflections increase and the path 18a again slows down. This is the conventional wisdom which motivates most designers to select the termination resistance, $R_t$, to be equal to the characteristic impedance, $Z_o$, of the bus path 18a.

However, as previously described in connection with FIG. 1, the path 18a is actually a distributed impedance network which includes a number of transmission line stubs and distributed capacitances, inductances, and resistances. Thus, the curve 28 only represents one of the possible worst case conditions for switching signals on the bus path 18a. Curve 29 represents a second extreme condition where two different drivers alternately drive the bus, as was described in connection with FIGS. 2 and 3B. In this condition, the lower the value of $R_t$, the more current flow, and the more energy is stored in the distributed impedances in the path 18a. As a result, the longer it takes for any reflections to settle out. Although a solution might seem to be to select an infinite termination resistance, the bus path 18a would then never be deasserted.

We have realized that an optimum termination resistance, $R_t$, is the particular resistance, $R_1$, that represents the intersection 39 of the curves 28 and 29. This is because if a single driver 40a is present on the bus path 18a and alternately asserting and deasserting the bus path 18a, a higher resistance $R_1$ results in longer settling time, $t_b$, than the minimum possible settling time, $t_a$. However, when two drivers 40a and 40c successively share access to the bus path 18a, a shorter propagation delay, $t_b$, is provided, rather than the higher delay $t_c$, which would be experienced if the termination resistors 27 were selected to be the characteristic impedance, $Z_o$. By selecting $R_1$ as the termination resistance, then, the worst case propagation delay is reduced from $t_c$ to $t_b$.

In addition, since the effective total termination impedance $R_t$ actually decreases as additional modules are inserted into the system, the worst case settling time $t_b$ will actually decrease as modules are added, provided that the drivers 40 can handle the additional loads.

3. DRIVER OUTPUT ENABLE AND TEST LOGIC

Figure 5:
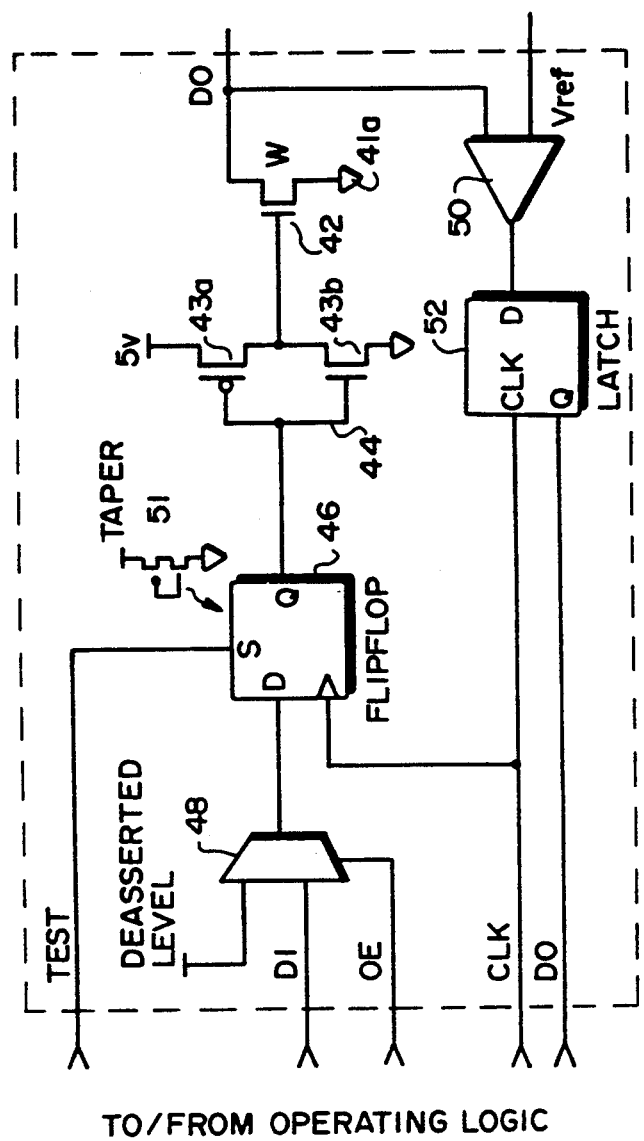
FIG. 5 is a detailed circuit diagram of the open drain driver/receivers shown in FIG. 1.

As shown in FIG. 5, a typical driver/receiver 40a is a synchronous circuit that includes a driver latch or flip flop 46 and a receiver latch or flip flop 52 controlled by a common clock signal CLK, where the driver flip flop 46 has its disable and test input logic outside of the critical clock circuit signal path.

In particular, driver/receiver 40a includes an open drain or open collector driver transistor 42, an inverter 44, an output flip flop 46, a multiplexor 48, a differential amplifier 50, and an input latch 52. The driver/receiver 40a accepts a data signal at a data input terminal (DI), an output enable signal (OE), a test control input (TEST), and a clock signal (CLK), and provides a data out signal (DO).

As illustrated in FIG. 1, the driver transistor 42 and inverter 44 are formed from metal oxide semiconductor field effect transistors (MOSFETs). Transistor 42 could also be a bipolar transistor in open collector configurations. The gate width, W, of the driver transistor 42 is selected to provide the appropriate drive current capabilities given the expected fully loaded impedance of conductive path 18a, within the constraints of an ASIC gate array.

In operation, when the voltage on the gate terminal of the driver transistor 42 is less than a gate turn on voltage, the driver transistor 42 is disabled, and the bus path 18a is deasserted to a high voltage, in this case two volts, via the termination resistor 27a, assuming that no other driver 40 is asserting the bus path 18a. However, if the gate voltage of transistor 42 is greater than its turn on voltage, the driver transistor 42 is enabled, and thus pulls the bus path 18a to the ground reference voltage 41a.

The Q output of the flip flop 46 controls the driver transistor 42 via the inverter 44. The inverter 44 is formed by a P-channel pull-up transistor 43a and an N-channel pull-down transistor 43b. The inverter 44 primarily serves to buffer the load of transistor 42 from the weaker logic level swings used by the operating logic circuits (not shown) internal to the IC 14a.

The multiplexor 48 provides a way to disable the driver transistor 42 without adversely affecting the propagation delay path between the data in terminal DI and the data out terminal DO at the output of the driver transistor 42. In particular, during normal operation of the driver/receiver 40a, the multiplexor 48 is selected so that the data at the DI terminal is fed to the D input of the flip flop 46. However, when the output enable line OE is deasserted, a deasserted logic level is connected to the D input of the flip flop 46. This, in turn, disables the driver transistor 42a and deasserts the open drain driver 40a. In the circuit shown, the deasserted level is a logic low level, which, when latched by the flip flop 46 and inverted by inverter 44, disables the driver transistor 42.

Thus, the decision whether or not the deasserted voltage level or the voltage level indicated by the data input DI will be passed through to the driver transistor 42 is made well before the arrival of a pulse on the clock signal CLK which causes the flip flop 46 to change state. This minimizes transistor count in the output stage of the driver 40a, and therefore minimizes the propagation delay. In contrast, certain prior schemes to disable driver transistors place the OE logic in the critical delay path, for example, between the flip flop 46 and the driver transistor 42.

It is also desirable for system test purposes to provide a TEST input to the driver/receiver 40a that causes it to deassert the bus path 18a. The TEST input logic must be separate from the OE logic, since the OE logic is usually controlled by the operating logic circuits (not shown), and since the TEST input is typically used to selectively disable the drivers 40.

The TEST control input is also placed outside of the critical path propagation delay. In the illustrated circuit, the TEST input controls a set input (S) of the D flip flop 46. As a result, when the S input is asserted, the flip flop 46 is set to a logic high, which disables the driver transistor 42 and releases the bus path 18a. Since the logic (not shown) which accomplishes the setting function of the S input is internal to the flip flop 46 and outside of the critical path between the CLK input and the driver transistor 42, the TEST input does not adversely affect the overall propagation delay of the driver/receiver 40a.

4. DRIVER TRANSISTOR SIZE TAPER

The inverter transistors 43a, 43b and those transistors comprising an output stage 51 of the flip flop 46 have the proper size taper to match the gate width, W, of the driver 42. In particular, a taper factor of approximately three is selected so that the input capacitances of the transistors 43a, 43b in the inverter 44 are approximately one-third of the input capacitance of the driver transistor 42. A similar one-third taper relationship holds for the capacitance of the output stage 51 of the flip flop 46 and the input capacitances of transistors 43a and 43b.

The tapering of the transistors in this manner simplifies the implementation of the invention in standard gate arrays or Application Specific Integrated Circuits (ASICs).

For example, in the illustrated embodiment, if the gate width, W, of the driver transistor 42 is 900 microns, then the inverter transistors 43a, 43b are implemented as three parallel 150 micron transistors, and the transistors in output stage 51 are implemented as three parallel 50 micron transistors.

5. BUS RECEIVER DESIGN

The receiver portion of the driver/receiver 40a consists of a differential amplifier 50 and the input latch 52. The receiver is synchronous in that the input latch 52 is clocked by the same clock signal CLK as the output flip flop 46.

A reference signal, Vref, is provided to the differential amplifier 50 by a reference voltage generation circuit. As shown in FIG. 1., a reference voltage generation circuit 59a on bus node 10a consists of a pair of resistors 63a, 63b connected between the Vdda termination voltage provided by the supply 60a which is local to bus node 10a. The resistance values of the resistors 63a, 63b are chosen to provide the optimum Vref for a given bus cycle time and a range of loaded impedances. A reference circuit 59a, 59b, ..., 59n is provided for each bus node 10a, 10b, ..., 10n, and so reference voltages Vrefa, Vrefb, ..., Vrefn are generated on each bus node 10.

The foregoing description has been limited to a specific embodiment of this invention. It will be apparent, however, that variations and modifications may be made to the invention, with the attainment of some or all of its advantages.

What is claimed is:

1. An electronic system including a plurality of circuit board modules, wherein each module is interconnected to the other modules via a data bus consisting of a plurality of conductive paths, the data bus of the type which uses distributed termination impedances, and wherein each module comprises:

operating logic circuits, mounted on the module, which provide a plurality of transmit logic signals to be communicated to the logic circuits located on the other modules, and which also receive a plurality of receive logic signals from the logic circuits located on the other modules;

a direct current (DC) power supply circuit, located on the module, for providing a power supply signal to the logic circuits mounted on the same module;

an open drain driver transistor, connected to receive one of the transmit logic signals from the logic circuits, and connected to one of the conductive paths, to thereby forward the logic signal to another module;

a termination impedance, mounted on the module, and connected between the conductive path and the power supply, such that each conductive path has a single termination impedance connected thereto in each module;

a reference voltage circuit, connected to receive the power supply signal, and to generate a reference voltage; and a differential receiver, connected to receive the reference voltage and connected to one of the conductive paths, for receiving a receive logic signal from one of the other modules, and to thereby forward the receive logic signal to the operating logic circuits.

2. An electronic system as in claim 1 wherein the resistance of the termination impedance is chosen so that a minimum propagation delay is provided on the data bus both when a driver transistor in a given module drives a logic signal consisting of alternating logic levels in succession, as well as when the driver transistors in two different modules drive a given logic level in succession.

3. An electronic system as in claim 1 comprising:
a clock generator, for generating a clock signal; and
a driver flip flop, connected to receive the transmit logic signal and the clock signal, and to provide a latched transmit logic signal to the driver.

4. An electronic system as in claim 3 comprising:
a receiver latch, connected to the differential receiver and the clock signal, and to provide a latched receive logic signal to the operating logic circuits.

5. An electronic system as in claim 3 comprising:
a multiplexor, connected to receive an output enable signal, the transmit logic signal from the operating logic, and a deasserted logic signal, and connected to drive a data input of the driver flip flop, for connecting the transmit logic signal to the data input of the driver flip flop when the output enable signal is asserted, and for connecting the deasserted logic signal to the data input of the driver flip flop when the output enable signal is deasserted.

6. An electronic system as in claim 3 wherein the driver flip flop additionally has a test input which, when asserted, causes the driver transistor to deassert the conductive path to which it is connected.

7. An electronic system as in claim 3 comprising:
an inverter formed by a pull-up transistor and a pull-down transistor, connected between the driver flip flop and the driver transistor.

8. An electronic system as in claim 7 wherein the gate width of the inverter transistors are tapered to match the driver transistor, and the gate widths of output transistors in the driver flip flop are tapered to match the inverter transistors.

9. An electronic system including a plurality of circuit board modules, wherein each module is interconnected to the other modules via a data bus consisting of a plurality of conductive paths, the data bus of the type which makes use of distributed termination impedances, and wherein each module comprises:
operating logic circuits, mounted on the module, which provide a plurality of transmit logic signals to be communicated to the logic circuits located on the other modules, and which also receive a plurality of receive logic signals from the logic circuits located on the other modules;
a multiplexor, connected to receive an output enable signal, to receive one of the transmit logic signals from the operating logic circuits, and a deasserted logic signal, for providing the transmit logic signal as a multiplexor output signal when the output enable signal is asserted, and for providing the deasserted logic signal as a multiplexor output signal when the output enable signal is deasserted;
a clock generator, for generating a clock signal;
a driver flip flop, connected to receive one of the transmit logic signals from the operating logic circuits at a data input and the clock signal, and to provide a latched transmit logic signal;
a direct current (DC) power supply circuit, located on the module, for providing a termination voltage to the logic circuits mounted on the same module;
an open drain driver transistor, connected to receive the latched transmit logic signal, and connected to one of the conductive paths, to thereby forward the latched transmit logic signal to another module;
a termination impedance, mounted on the module, and connected between the conductive path and the termination voltage, such that the conductive path has a single termination impedance connected thereto in each module, the resistance of the termination impedance being chosen so that a minimum propagation delay is provided on the conductive path both when the driver transistor in a given module drives a logic signal consisting of alternating logic levels in succession, as well as when the driver transistors in two different modules drive a given logic level in succession;
a reference voltage circuit, connected to receive the termination voltage, and to generate a reference voltage;
a differential receiver, connected to receive the reference voltage and connected to one of the conductive paths, for receiving a receive logic signal from one of the other modules, and to thereby provide a differential logic signal; and
a receiver latch, connected to the differential receiver and the clock signal, to provide a latched receive logic signal to the operating logic circuits.

10. An electronic system as in claim 9 wherein the driver flip flop additionally has a test input which, when asserted, causes the driver transistor to deassert the conductive path to which it is connected.

11. An electronic system as in claim 9 comprising:
an inverter formed by a pull-up transistor and a pull-down transistor, connected between the driver flip flop and the driver transistor.

12. A bus node for connecting to other bus nodes via a data bus consisting of a plurality of conductive paths, the data bus of the type which uses distributed termination impedances, wherein each bus node comprises:
an open drain driver transistor, connected to one of the conductive paths;
means for providing a bus termination voltage;
a termination impedance, located at the bus node, and connected between the conductive path and the termination voltage, such that each conductive path has a single termination impedance connected thereto at each bus node;
a reference voltage circuit, connected to the termination supply voltage, and to generate a reference voltage; and
a differential receiver, connected to receive the reference voltage and connected to one of the conductive paths.

13. A bus node as in claim 12 wherein the resistance of the termination impedance is chosen so that a minimum propagation delay is provided on the conductive paths both when a driver transistor in a given node drives a logic signal consisting of alternating logic levels in successive bus cycles, as well as when the driver transistors in two different bus nodes drive an identical logic level in successive bus cycles.

14. A bus node as in claim 12 comprising:
a clock generator, for generating a clock signal; and
a driver flip flop, connected to receive a transmit logic signal and the clock signal, and to provide a latched transmit logic signal to the driver.

15. A bus node as in claim 14 comprising:
a receiver latch, connected to the differential receiver and the clock signal, and to provide a latched receive signal and an output.

16. A bus node as in claim 14 comprising:
a multiplexor, connected to receive an output enable signal, the transmit logic signal, and a deasserted logic signal, and connected to drive a data input of the driver flip flop, for connecting the transmit logic signal to the data input of the driver flip flop when the output enable signal is asserted, and for connecting the deasserted logic signal to the data input of the driver flip flop when the output enable signal is deasserted.

17. A bus node as in claim 14 wherein the driver flip flop includes a test input which, when asserted, causes the driver transistor to deassert the conductive path to which it is connected.

18. A bus node as in claim 14 comprising:
an inverter formed by a pull-up transistor and a pull-down transistor, connected between the driver flip flop and the driver transistor.

19. A bus node as in claim 18 wherein the gate width of the inverter transistors are tapered to match the driver transistor, and the gate widths of output transistors in the driver flip flop are tapered to match the inverter transistors.

20. A method for sending data signals between modules in an electronic system over a data bus consisting of a plurality of conductive paths, the data bus of the type which uses distributed termination impedances, the method comprising the steps of, in each module:
providing a plurality of transmit logic signals to be communicated to other modules;
generating a direct current (DC) termination voltage;
forwarding the transmit logic signal to one of the other modules by connecting an open drain driver transistor between the transmit logic signal and one of the conductive paths;
connecting a termination impedance between the conductive path and the termination voltage, such that each conductive path has a single termination impedance connected thereto in each module;
generating a local reference voltage from the termination voltage; and
detecting a receive logic signal by comparing the local reference voltage to the voltage on one of the conductive paths.

21. A method as in claim 20 wherein the resistance of the termination impedance is chosen so that a minimum propagation delay is provided on the data bus both when a driver transistor in a given module drives a logic signal consisting of alternating logic levels in succession, as well as when the driver transistors in two different modules drive a given logic level in succession.

22. A method as in claim 20 comprising:
generating a clock signal; and
latching the transmit logic signal in synchronism with the clock signal.

23. A method as in claim 22 comprising:
latching the receive logic signal in synchronism with the clock signal.

24. A method as in claim 22 comprising:
selecting the transmit logic signal as an operating logic signal when an output enable signal is asserted, and selecting a deasserted logic signal as the transmit logic signal when the output enable signal is deasserted.

25. A method as in claim 22 wherein the transmit logic signal may additionally be selected as the deasserted logic signal when a test input signal is asserted.

26. A method as in claim 22 comprising:
inverting the transmit logic signal before forwarding it to the driver transistor.

27. A method as in claim 26 wherein transmitted logic signal is inverted by forwarding it though a pair of inverter transistors, and a gate width of the inverter transistors is tapered to optimize driving the load presented by the gate of the driver transistor.

28. A method of operating a open drain driver and differential receiver in a bus node, wherein the bus node is connected to a bus making use of distributed termination impedances, the method comprising the steps of:
connecting the open drain driver to one of the conductive paths;
providing a bus termination voltage in each bus node;
connecting a termination impedance between each conductive path and the termination voltage, such that each conductive path has a single termination impedance connected thereto at each bus node;
generating a local reference voltage from the termination voltage; and
detecting a receive logic signal by comparing the local reference voltage to the voltage on one of the conductive paths.

29. A method as in claim 28 wherein the resistance of the termination impedance is chosen so that a minimum propagation delay is provided on the conductive paths both when a driver drives a logic signal consisting of alternating logic levels in successive bus cycles, as well as when drivers in two different bus nodes drive an identical logic level in successive bus cycles.

30. A method as in claim 28 comprising:
generating a clock signal; and
latching a driver input signal in synchronism with the clock signal.

31. A method as in claim 28 comprising:
generating a receive clock signal; and
latching the receive logic signal in synchronism with the clock signal.

32. A method as in claim 28 comprising:
selecting a deasserted logic signal as a driver input signal when an output enable signal is asserted, and for otherwise selecting a transmit logic signal as a driver input signal when the output enable signal is deasserted.

33. A method as in claim 28 comprising:
selecting the deasserted logic signal as a driver signal input when a test signal is asserted.

34. A method as in claim 32 comprising:
inverting the driver input signal.

35. A method as in claim 34 wherein the step of inverting is provided by a pair of inverter transistors, and the gate width of the inverter transistors is tapered to optimize driving the load presented by the gate of a transistor in the driver.

* * * * *